US009831087B2

(12) United States Patent
Ong et al.

(10) Patent No.: US 9,831,087 B2
(45) Date of Patent: Nov. 28, 2017

(54) SPLIT GATE EMBEDDED FLASH MEMORY AND METHOD FOR FORMING THE SAME

(71) Applicant: WaferTech, LLC, Camas, WA (US)

(72) Inventors: Pang Leen Ong, Camas, WA (US); Ganesh Yerubandi, Camas, WA (US); Arjun Gupta, Vancouver, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

(21) Appl. No.: 15/259,996

(22) Filed: Sep. 8, 2016

(65) Prior Publication Data

US 2017/0069501 A1    Mar. 9, 2017

Related U.S. Application Data

(60) Provisional application No. 62/216,279, filed on Sep. 9, 2015.

(51) Int. Cl.
| | | |
|---|---|---|
| H01L 21/28 | (2006.01) | |
| H01L 21/336 | (2006.01) | |
| H01L 21/265 | (2006.01) | |
| H01L 27/11521 | (2017.01) | |
| H01L 29/423 | (2006.01) | |
| H01L 29/66 | (2006.01) | |

(52) U.S. Cl.
CPC .. *H01L 21/26513* (2013.01); *H01L 21/28273* (2013.01); *H01L 27/11521* (2013.01); *H01L 29/42328* (2013.01); *H01L 29/66825* (2013.01)

(58) Field of Classification Search
CPC ......... H01L 21/26513; H01L 21/28273; H01L 21/28282; H01L 27/115; H01L 27/11521; H01L 27/11568
See application file for complete search history.

(56) References Cited

U.S. PATENT DOCUMENTS

| | | | | |
|---|---|---|---|---|
| 6,309,928 B1 * | 10/2001 | Sung | ................. | H01L 21/28273 257/E21.209 |
| 6,486,032 B1 * | 11/2002 | Lin | .................... | H01L 21/28273 257/E21.209 |
| 2012/0231594 A1 * | 9/2012 | Wang | ................. | H01L 21/28273 438/266 |

* cited by examiner

*Primary Examiner* — Daniel Shook
(74) *Attorney, Agent, or Firm* — Duane Morris LLP

(57) ABSTRACT

Provided is a split-gate embedded flash memory cell and method for forming the same. The flash memory cell includes split-gate transistors in which the control gate is aligned with respect to the floating gate without the use of a photolithographic patterning operation to pattern the material from which the control gates are formed. An anisotropic blanket etching operation is used to form the floating gates of the split-gate floating gate transistors alongside sidewalls of a sacrificial layer. Local oxidation of silicon (LOCOS) methods are not needed to form the inter-gate dielectric and therefore high integrity is maintained for the floating transistor gates. The floating transistor gates are formed of charge storage material such as silicon nitride, $Si_3N_4$ in some embodiments.

20 Claims, 4 Drawing Sheets

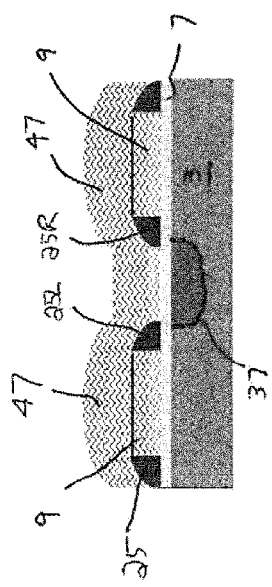
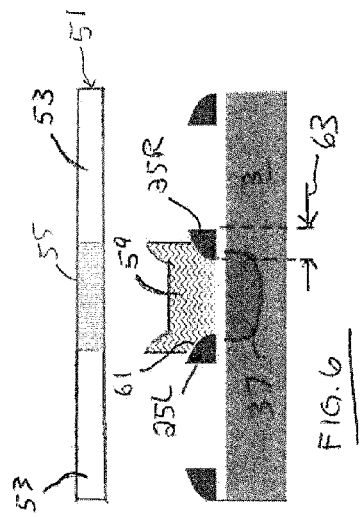
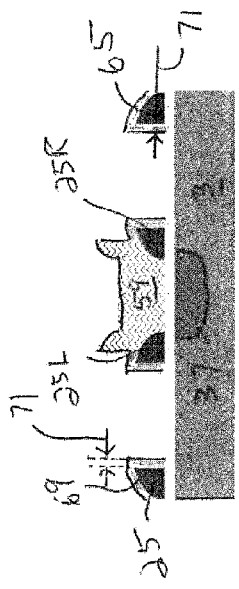
FIG. 5
FIG. 6
FIG. 7

SPLIT GATE EMBEDDED FLASH MEMORY AND METHOD FOR FORMING THE SAME

RELATED APPLICATION

This application claims benefit under 37 C.F.R. §119(e) to U.S. Provisional Appl. No. 62/216,279, filed on Sep. 9, 2016, and entitled "SPLIT GATE EMBEDDED FLASH MEMORY AND METHOD FOR FORMING THE SAME," which is hereby incorporated by reference in its entirety.

BACKGROUND

A flash memory is a non-volatile storage device that can be electrically erased and reprogrammed. Flash memories are commonly used in microcontrollers and in memory cards, USB flash drives and solid-state drives for general storage and transfer of data between computers and other digital products. Flash memory devices typically store information in an array of memory cells made using floating gate transistors.

A floating gate transistor is a field effect transistor having a structure similar to a conventional metal oxide semiconductor field effect transistor (MOSFET). Floating gate MOSFETs are distinguished from conventional MOSFETs because the floating gate MOSFET transistor is a split gate transistor that includes two gates instead of one. Split gate embedded flash memory devices are widely favored because of their compatibility with complementary metal oxide semiconductor (CMOS) technology. In addition to an upper control gate, a split gate transistor includes an additional floating gate beneath the control gate and above the transistor channel but completely electrically isolated by an insulating layer such as an oxide layer that completely surrounds the floating gate. This electrically isolated floating gate creates a floating node in direct current (DC) operation with a number of inputs or secondary gates such as the control gate, formed above the floating gate and electrically isolated from it. These secondary gates or inputs are only capacitively connected to the floating gate as the floating gate is completely surrounded by highly resistive material, i.e. the insulating layer. Any charge placed on the floating gate is trapped there and the floating gate remains unchanged for long periods of time until the floating gate MOSFET is erased. Unless erased, the floating gate will not discharge for many years under normal conditions. Fowler-Nordheim Tunneling or other Hot-Carrier injection mechanisms may be used to modify the amount of charge stored in the floating gate, e.g. to erase the floating gate. The programming and erase operations are therefore critical to the operation of floating gate transistors.

The integrity of the control gate and the floating gate as well as the integrity of the insulating layer between the control gate and the floating gate, is very important because of the aforementioned electrical considerations. The electrical considerations also render the charge storage ability of the floating gate and the alignment between the control gate and the floating gate, similarly important. The floating gate, the control gate and the oxide or other dielectric layer that isolates the floating gate from the control gate, should advantageously be of high integrity and defect-free and aligned accurately with respect to one another.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 1-9 are each cross-sectional views and represent a sequence of processing operations used to form various embodiments of a flash memory cell according to the various embodiments of the disclosure.

DETAILED DESCRIPTION

The disclosure relates to semiconductor devices and methods for making the same.

Various embodiments of the disclosure provide a split-gate flash cell that includes one or more split-gate transistors. The split-gate transistors include both a floating gate and a control gate. In various embodiments of the disclosure, the control gate is self-aligned with respect to the floating gate and each are formed from a layer of material without photolithographically patterning that layer of material. In some embodiments, "self-aligned" refers to the fact that the control gate is formed and aligned with respect to the floating gate without a photolithographic patterning operation, which will be discussed in further detail below with respect to FIG. 9. Various embodiments of the disclosure provide for forming the split gate flash memory without using Local Oxidation of Silicon (LOCOS) processing which is prone to creating defects in the floating gate during the LOCOS operation because the LOCOS operation consumes silicon from the floating gate. Because the various embodiments of the disclosure provide for forming the split gate floating gate transistor without LOCOS processing, the floating gate need not be formed of an oxidizable material such as polysilicon and may be formed of various other materials such as various charge storage materials.

Various embodiments of the disclosure provide for forming the floating gates without patterning the floating gate layer of material using photolithography and also for aligning the control gate with respect to the floating gates without patterning the control gate using a photolithographic patterning operation to pattern the material from which the control gate is formed.

Figure 1:
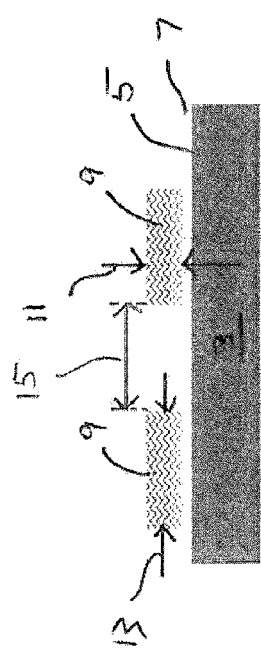

Now turning to the figures, FIG. 1 is a cross-sectional view showing substrate 3 over which is formed gate dielectric 7 and sacrificial structures 9. Substrate 3 may be any of various suitable substrates such as silicon or other materials used in the semiconductor manufacturing industry. Gate dielectric 7 is formed over surface 5 of substrate 3 and gate dielectric 7 may be of various thicknesses. In various embodiments, gate dielectric 7 may be an oxide or a high-k gate dielectric material such as $Ta_2O_5$, $Al_2O_3$, $ZrO_2$, $HfO_2$, $HfSiO_xN_y$, or $Ba_xSr_yTiO_3$ ("BST") but other suitable gate dielectric materials may be used in other embodiments. Sacrificial structures 9 are formed by depositing or otherwise forming a layer of sacrificial material over gate dielectric layer 7 then patterning the sacrificial layer to form sacrificial structures 9. In some embodiments, sacrificial structures 9 may be formed of tetraethylorthosilicate, TEOS, but other suitable sacrificial materials are used in other embodiments. Thickness 11 of sacrificial structures 9 may lie in the range of about 800-1500 angstrom and may be about 1000 angstroms in some embodiments but various other suitable thicknesses are used in other embodiments and are determined by various device factors. Width 13 of sacrificial structures 9 and spacing 15 between adjacent sacrificial structures 9 will generally be determined by the desired device density and integration levels. Width 13 may vary from about 4000 to 8000 Angstroms and spacing 15 may vary from about 2000 to 6000 Angstroms in various embodiments of the disclosure, but other dimensions are used in other embodiments depending on the desired device density.

Figure 2:
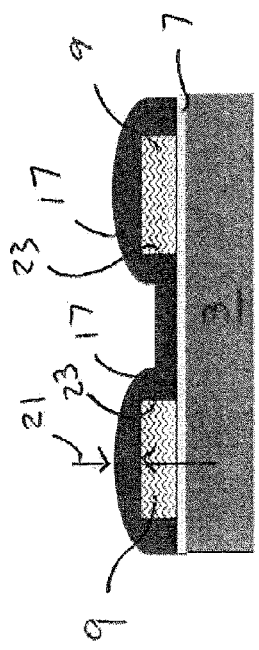

Now turning to FIG. 2, floating gate material layer 17 is formed over the structure shown in FIG. 1. Floating gate material layer 17 may be formed using various methods for depositing or otherwise forming a film. In some embodiments of the disclosure, floating gate material layer 17 is polysilicon which may be doped or undoped. In some embodiments, floating gate material layer 17 may include a silicide formed over doped or undoped polysilicon. In other embodiments of the disclosure, floating gate material layer 17 is formed of other suitable conductive or semiconductor materials. In various embodiments of the disclosure, floating gate material layer 17 is formed of silicon nitride, $Si_3N_4$. In various embodiments, silicon nitride serves as a superior charge trapping material. In various other embodiments, various other suitable charge trapping materials are used for floating gate material layer 17. Because the various embodiments of the disclosure provide for forming the split gate floating gate transistor without LOCOS processing, floating gate material layer 17 need not be formed of an oxidizable material such as polysilicon and may be formed of silicon nitride, $Si_3N_4$ or various other charge storage materials.

FIG. 2 shows that floating gate material layer 17 is conformally formed over the structure of FIG. 1 and is therefore thicker in some areas than in other areas. For example, floating gate material layer 17 is thicker in areas adjacent sidewalls 23 of sacrificial structures 9, than in other areas. Floating gate material layer 17 includes a bulk thickness 21 that may range from about 800 to about 2000 angstroms in various embodiments and may include a thickness 21 of about 1000 angstroms, in one embodiment, but other suitable thicknesses are used in other embodiments.

Each of the aforementioned thicknesses and spacings and other dimensions are given for example only and various other dimensions are used in other embodiments of the disclosure and may be determined by various device considerations such as intended dimensions of other device features, the degree of integration sought and the manufacturing tool capabilities.

Figure 3:
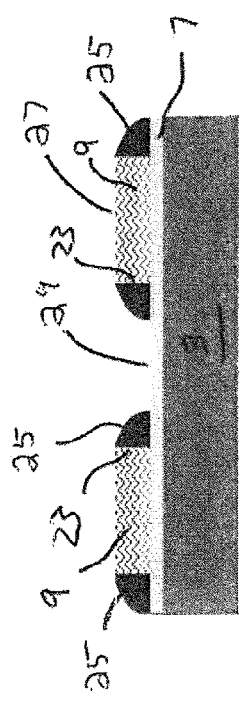

Floating gate material layer 17 is then formed into a number of floating gates using an anisotropic etching process and without the use of a photolithographic pattern on floating gate material layer 17. In other words, floating gate material layer 17 is not patterned using a photolithographic process. Rather, a suitable anisotropic etching process is carried out upon the structure of FIG. 2, to produce the structure of FIG. 3. Because of the anisotropic nature of the etch process and the increased thickness of floating gate material layer 17 along sidewalls 23 of sacrificial structures 9, spacers 25 are created as shown in FIG. 3. Various suitable anisotropic etching processes may be used and are chosen in conjunction with the material being etched, i.e. floating gate material layer 17, as described above. The thickness of floating gate material layer 17 is also chosen in conjunction with the anisotropic etch process to be used and the dimensions of sacrificial structures 9. The etching process is carried out such that top surfaces 27 of sacrificial structures 9 are exposed and also such that surface 29 of gate dielectric 7 is also exposed. In FIG. 3, there are four spacers 25 illustrated, each along a sidewall 23 of sacrificial structure 9. The dimensions, i.e. the height, width and curvature of spacers 25 will be of various values in various embodiments and it will be seen that spacers 25 are used as floating gates in split gate transistors, according to the process sequence illustrated in the following figures.

Figure 4:
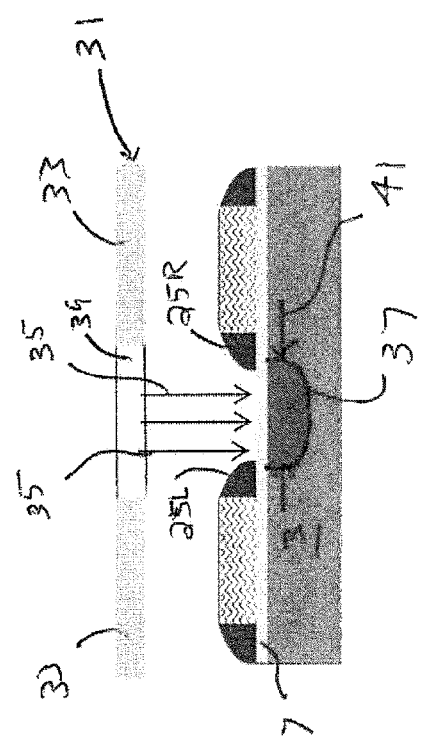

FIG. 4 shows an ion implantation operation being carried out upon the structure shown in FIG. 3. Photomask 31 is shown schematically to indicate blocked areas 33 and open areas 39. Ion implantation indicated by arrows 35, takes place only through open areas 39 but not through blocked areas 33. Various known or other methods for using photomask 31 to form a pattern of a masking material on the illustrated device structure, are used in various embodiments of the disclosure. During the ion implantation operation, blocked areas 33 are covered with a masking material such as photoresist in various embodiments but other masking films are used in other embodiments of the disclosure.

With the masking pattern in place, various suitable ionic species are implanted, indicated by arrows 35, into substrate 3 to form source line dopant implant region 37. Source line dopant implant region 37 may be formed of various dopant species such as arsenic, phosphorus, or antimony and source line dopant implant region 37 takes on various dimensions including width 41. In FIG. 4, width 41 of source line dopant implant region 37 is determined by the spacing between adjacent spacers 25L, 25R. Various ion implantation energies and dopant ion concentrations may be used according to various embodiments of the disclosure. In some embodiments, the ion implantation details include dosage level between about 1E14 ions/cm$^2$ and about 1E16 ions/cm$^2$ and an energy level between about 5 keV and about 80 keV, but other process details for the ion implantation process are used in other embodiments and are chosen to produce source line dopant implant region 37 of desired dimensions and dopant concentrations. The desired dimensions and dopant concentrations, in turn, are determined by the device functionality desired. In various embodiments, source line dopant implant region 37 will serve as a common source line dopant implant region for two adjacent split gate transistors that are separated by source line dopant implant region.

FIG. 5 shows insulating layer 47 formed over the structure of FIG. 4. In some embodiments of the disclosure, insulating layer 47 is tetraethylorthosilicate, TEOS, but other suitable insulating materials such as undoped silicate-glass ("USG") or HDP (high density plasma) CVD silicon-based dielectric films using silane (SiH4)/silicon tetrafluoride (SiF4) are used in other embodiments. In some embodiments, insulating layer 47 is formed of the same material as sacrificial structures 9 but in other embodiments, different materials are used for the two features. In some embodiments, insulating layer 47 and sacrificial structures 9 are formed of similar materials such as may be etched using a common etching operation. Insulating layer 47 may be formed to various thicknesses in various embodiments of the disclosure. Various deposition methods may be used to form insulating layer 47 according to various embodiments of the disclosure.

FIG. 6 shows the structure of FIG. 5 after patterning and etching operations have been carried out to remove the portions of insulating layer 47 and sacrificial structures 9 that were not covered by a masking material. In FIG. 6, photomask 51 is shown schematically to represent blocked portion 55 and open portions 53. A photomask such as photomask 51 shown in FIG. 6, may be used in conjunction with a masking material such as photoresist to form a masking material on the structure shown in FIG. 5 in which the areas represented by blocking portion 55 are covered with a masking material and are therefore masked from any etching operation. Various photomasks and masking materials such as photoresists, can be used in various embodiments. The areas represented by open portions 53 are not covered with a masking material and are therefore exposed and etched in the etching operation. Various photomasks and various photolithography tools and procedures may be used in various embodiments. The patterning operation is first carried out, then an etching operation is carried out to remove portions of insulating layer 47 and sacrificial structures 9 not covered by the masking material, producing the structure shown in FIG. 6.

FIG. 6 shows discrete segment 59 formed of insulating material from insulating layer 47. Discrete segment 59 fills the area between adjacent spacers 25L and 25R and is also disposed over portions of each of the respective adjacent spacers 25L and 25R. In some embodiments (not shown), discrete segment 59 completely covers each of the two adjacent spacers 25L and 25R and in other embodiments discrete segment 59 covers only portions of each of the two adjacent spacers 25L and 25R such as shown in FIG. 6. FIG. 6 shows discrete segment 59, contacting the curved, upper surfaces 61 of each of the respective adjacent spacers 25L and 25R. In some embodiments, discrete segment 59 extends laterally to cover about 25 to about 75 percent of the maximum width 63 of each of the respective adjacent spacers 25L and 25R. In some embodiments, discrete segment 59 terminates laterally at the inwardly oriented edges of the adjacent spacers 25L and 25R and does not cover either of the adjacent spacers 25L, 25R at all. The extent to which discrete segment 59 covers the adjacent spacers 25L and 25R determines the extent of overlap and overlay between a control gate that will be formed over the structure shown in FIG. 6.

FIG. 7 shows the structure of FIG. 6 after an inter-gate dielectric is formed. Inter-gate dielectric 65 is formed over exposed surfaces 69 of spacers 25, including adjacent spacers 25L and 25R. According to various embodiments of the disclosure, a deposition operation is carried out and according to other embodiments, an oxide growth operation is carried out under conditions in which the consumption of the spacer material is minimized. According to various embodiments of the disclosure, High-Temperature Oxide (HTO) process may be carried out to produce inter-gate dielectric 65. In various embodiments of the disclosure, the HTO film used for inter-gate dielectric 65 is deposited by an low pressure chemical vapor deposition (LPCVD) process. In various embodiments of the disclosure, the LPCVD process is carried out in a furnace at a temperature within a range of about 700-900° C. and with a pressure within the range of about 10 to 100 Torr. In some embodiments, additional process details for HTO processing include annealing at high temperature (>900° C.) in either a pure $N_2$ and/or a diluted $O_2$ (5-10%) ambient to reduce bulk trapping/defect density. Process parameters of other values are used on other embodiments, and are chosen to produce an inter-gate dielectric of desired thickness and to ensure that the operation is a deposition operation in nature. Because HTO is a deposition-based process, the HTO film such as inter-gate dielectric 65, can be easily formed over spacers 25 that are formed of any suitable material. Inter-gate dielectric 65 includes a thickness 71 that may range from about 50 angstroms to about 300 angstroms but other thicknesses may be used in other embodiments of the disclosure depending on desired electrical characteristics and other device factors.

Figure 8:
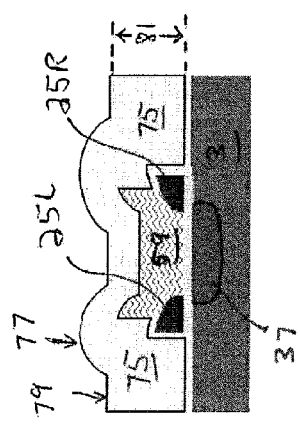

FIG. 8 shows the structure of FIG. 7 after control gate material layer 75 is formed over the structure in FIG. 7. Control gate material layer 75 is polysilicon in various embodiments of the disclosure and may be doped or undoped polysilicon. In other embodiments, control gate material layer 75 may be amorphous silicon. In other embodiments of the disclosure, control gate material layer 75 may be a metal or various other suitable semiconductor materials suited for use as control gates. Various highly-doped semiconductor materials are suitable for use as control gate material layer 75 and may be deposited or otherwise formed according to various methods. FIG. 8 also shows that, because of the configuration of discrete segment 59, control gate material layer 75 has different thicknesses in different regions. For example, in the region directly beneath location 77, the thickness is greater than the bulk thickness such as the thickness at location 79 and greater than the thickness of control gate material layer 75 directly over discrete segment 59. This is due to the conformality of the deposition process used to form control gate material layer 75. Control gate material layer 75 includes a thickness sufficient to cover the underlying structure and such that control gate material layer 75 may be used to form control gates that extend over the spacers 25. Control gate material layer 75 may include a bulk thickness 81 that may range from about 1500 to about 3000 angstroms but other thicknesses may be used in other embodiments of the disclosure.

Figure 9:
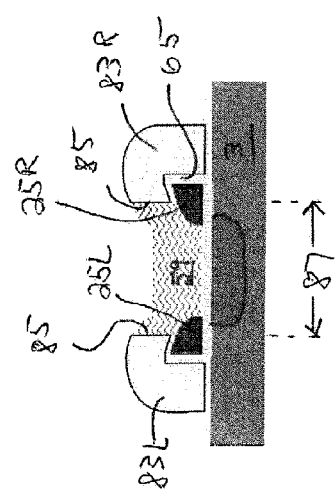

An anisotropic etching process is then carried out to produce the structure shown in FIG. 9 from the structure of FIG. 8. Bulk portions of control gate material layer 75 are removed and remaining are control gates 83 formed from material from control gate material layer 75. Control gate 83R and corresponding spacer 25R which serves as a floating gate, together form one floating gate transistor and control gate 83L together with spacer 25L which serves as a floating gate, form another floating gate transistor. As such, a photolithographic patterning operation is not needed to form the discrete control gates 83L and 83R, from the control gate material layer 75, to be aligned with respect to the respective floating gates (i.e., spacers 25L and 25R), which means that the control gates 83L and 83R are each "self-aligned" formed with respect to the respective floating gate.

Control gate 83R is separated from corresponding spacer 25R by inter-gate dielectric 65. Control gate 83L is separated from control gate 83R by discrete segment 59. The respective control gates 83L, 83R terminate inwardly laterally at the opposed end surfaces 85 of discrete segment 59. Width 87 of discrete segment 59 determines the spacing between adjacent control gates, i.e. the spacing between the most proximate portions of control gates 83L and 83R. The extent to which discrete segment 59 extends over the spacers 25L 25R also determines the overlay degree of the control gate 83R over corresponding spacer 25R which serves as the floating gate. The control gate, such as control gate 83L may include a portion that extends over the corresponding floating gate, i.e. over spacer 25L to various degrees. In some embodiments of the disclosure, control gate 83L extends over top of the entire corresponding spacer 25L, i.e., in embodiments in which discrete segment 59 does not extend over the spacers 25L, 25R. In other embodiments, no portion of control gate 83L is disposed directly over top of the corresponding spacer 25L. In various other embodiments, control gate 83L extends over corresponding spacer 25L to various percentages of the maximum width 63 of corresponding spacer 25L (see FIG. 7) and the same is true for control gate 83R and corresponding spacer 25R. Various further processing operations are then carried out upon the structure shown in FIG. 9 to form functional and connected split-gate transistors to form flash memory cells and other devices.

In various embodiments of the disclosure, a method for forming a semiconductor device is provided. The method comprises forming a plurality of floating transistor gates as spacers alongside sacrificial structures and over a gate dielectric disposed over a substrate. The method further comprises forming a discrete segment of an insulating layer in an interposed area interposed between two adjacent floating transistor gates of the plurality of floating transistor gates, depositing an inter-gate dielectric at least along exposed surfaces of each of the two adjacent floating transistor gates and forming control gates alongside and partially over each of the two adjacent floating transistor gates. The discrete segment is disposed between the control gates and the control gates are separated from the respective floating transistor gates by the inter-gate dielectric.

According to various other embodiments of the disclosure, a method for forming a semiconductor device is provided. The method comprises anisotropically etching an unpatterned layer of a gate material to form a plurality of floating transistor gates as spacers alongside sacrificial structures. The spacers are disposed over a gate dielectric disposed over a substrate. The method further comprises forming a discrete segment of an insulating layer that completely fills an interposed area between two adjacent floating transistor gates of the plurality of floating transistor gates. The method also comprises depositing an inter-gate dielectric at least along exposed surfaces of each of the two adjacent floating transistor gates and forming control gates alongside and partially over outwardly facing sides of each of the two adjacent floating transistor gates by anisotropically etching a control gate material such that portions of the control gate material over the discrete segment are completely removed and the discrete segment is disposed between the control gates. The control gates are separated from the respective floating transistor gates by the inter-gate dielectric.

According to various other embodiments of the disclosure, a method for forming a semiconductor device is provided. The method comprises anisotropically etching an unpatterned layer of a gate material to form a plurality of floating transistor gates as spacers alongside sacrificial structures, the spacers disposed over a gate dielectric disposed over a substrate. The method also includes depositing an inter-gate dielectric on exposed surfaces of each of the floating transistor gates and forming control gates partially over and alongside outwardly facing sides of each of two adjacent floating transistor gates of the plurality of floating transistor gates, by anisotropically etching a control gate material without forming a photolithographic pattern on the control gate material. The control gates are separated from the respective floating transistor gates by the inter-gate dielectric, and from one another by an insulating material that extends partially over each of the two adjacent floating transistor gates.

The preceding merely illustrates the principles of the disclosure. It will thus be appreciated that those skilled in the art will be able to devise various arrangements which, although not explicitly described or shown herein, embody the principles of the various embodiments of the disclosure and are included within its spirit and scope. Furthermore, all examples and conditional language recited herein are principally intended expressly to be only for pedagogical purposes and to aid the reader in understanding the principles of the embodiments of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor device, said method comprising:
    forming a plurality of floating transistor gates as spacers alongside sacrificial structures and over a gate dielectric disposed over a substrate;
    forming a discrete segment of an insulating layer in an interposed area interposed between two adjacent floating transistor gates of said plurality of floating transistor gates, wherein said insulating layer is formed over said sacrificial structures;
    forming an inter-gate dielectric at least along exposed surfaces of each of said two adjacent floating transistor gates; and
    forming control gates alongside and partially over each of said two adjacent floating transistor gates, said discrete segment disposed between said control gates and said control gates separated from said respective floating transistor gates by said inter-gate dielectric.

2. The method as in claim 1, wherein said forming control gates includes forming a layer of control gate material then forming said control gates from said layer of control gate material without using a photolithographic patterning operation to pattern said layer of control gate material.

3. The method as in claim 2, wherein said forming control gates includes forming said layer of control gate material over said discrete segment and over said floating transistor gates then anisotropically etching to form said control gates from said layer of control gate material such that said control gates terminate laterally at opposed ends of said discrete segment.

4. The method as in claim 1, wherein said floating transistor gates comprise silicon nitride.

5. The method as in claim 1, wherein said forming an inter-gate dielectric comprises depositing an oxide using high temperature oxidation (HTO).

6. The method as in claim 1, wherein said forming an inter-gate dielectric comprises depositing a high temperature oxidation (HTO) oxide using low pressure chemical vapor deposition (LPCVD).

7. The method as in claim 1, further comprising forming said sacrificial structures by forming a first layer over said gate dielectric then patterning said first layer and wherein said forming a plurality of floating transistor gates includes depositing a floating gate material over said sacrificial structures then anisotropically etching, and wherein said forming a discrete segment comprises forming said insulating layer over said plurality of floating transistor gates and patterning and further etching to form said discrete segment from said sacrificial structures.

8. The method as in claim 1, wherein said gate dielectric comprises a high-k dielectric material, said forming an inter-gate dielectric comprises depositing an oxide using low pressure chemical vapor deposition (LPCVD) and further comprising, after said forming a plurality of floating transistor gates, implanting ionic dopant impurities into said substrate to form a source line dopant impurity region in said substrate in said interposed area.

9. The method as in claim 1, wherein said sacrificial structures and said insulating layer are each formed of tetraethyl orthosilicate (TEOS).

10. The method as in claim 1, wherein said discrete segment completely fills a space between said two adjacent transistor floating gates and covers portions of respective upper surfaces of each of said two adjacent transistor floating gates and said control gates terminate laterally at opposed ends of said discrete segment.

11. The method as in claim 1, wherein said forming control gates comprises forming a conductive layer and etching to remove portions of said conductive layer from said interposed area without photolithographically patterning said conductive layer, said conductive layer comprising at least one of polysilicon and metal.

12. The method as in claim 1, wherein said forming control gates includes forming said control gates along outwardly disposed sides of each of said respective two adjacent floating transistor gates and said control gates are separated from said respective floating transistor gates only by said inter-gate dielectric.

13. A method for forming a semiconductor device, said method comprising:
anisotropically etching an unpatterned material layer to form a plurality of floating transistor gates as spacers alongside sacrificial structures, said spacers disposed over a gate dielectric disposed over a substrate;
forming a discrete segment of an insulating layer that completely fills an interposed area between two adjacent floating transistor gates of said plurality of floating transistor gates and extends partially over each of said two adjacent floating transistor gates, wherein said insulating layer is formed over said sacrificial structures;
depositing an inter-gate dielectric at least along exposed surfaces of each of said two adjacent floating transistor gates; and
forming control gates partially over and alongside outwardly facing sides of each of said two adjacent floating transistor gates by anisotropically etching a control gate material such that portions of said control gate material over said discrete segment are completely removed and said discrete segment is disposed between said control gates,
wherein said control gates are separated from said respective floating transistor gates by said inter-gate dielectric.

14. The method as in claim 13, wherein said floating transistor gates comprise silicon nitride.

15. The method as in claim 13, wherein said depositing an inter-gate dielectric comprises depositing a high temperature oxidation (HTO) oxide using low pressure chemical vapor deposition (LPCVD).

16. The method as in claim 13, wherein said gate dielectric comprises a high-k dielectric material, and further comprising implanting ionic dopant impurities into said substrate to form a source line dopant impurity region in said substrate in said interposed area.

17. A method for forming a semiconductor device, said method comprising:
forming a plurality of floating transistor gates as spacers alongside sacrificial structures by anisotropically etching an unpatterned material layer, said spacers disposed over a gate dielectric disposed over a substrate; and
depositing an inter-gate dielectric on exposed surfaces of each of said floating transistor gates; and forming control gates alongside and partially over outwardly facing sides of each of two adjacent floating transistor gates of said plurality of floating transistor gates, by anisotropically etching a control gate material without forming a photolithographic pattern on said control gate material,
wherein said control gates are separated from said respective floating transistor gates by said inter-gate dielectric, and from one another by an insulating material that extends partially over each of said two adjacent floating transistor gates, wherein said insulating material is formed from an insulating layer over said sacrificial structures.

18. The method as in claim 17, wherein said depositing an inter-gate dielectric comprises depositing a high temperature oxidation (HTO) oxide using low pressure chemical vapor deposition (LPCVD).

19. The method as in claim 17, wherein said floating transistor gates comprise silicon nitride.

20. The method as in claim 17, further comprising forming said sacrificial structures by forming a first layer over said gate dielectric then patterning said first layer, and wherein said insulating material comprises a discrete segment formed by forming the insulating layer over said plurality of floating transistor gates then patterning and etching to form said discrete segment, said sacrificial structures and said discrete segment each formed of tetraethylorthosilicate (TEOS).

* * * * *